US011707738B2

(12) United States Patent
Panwar et al.

(10) Patent No.: US 11,707,738 B2
(45) Date of Patent: Jul. 25, 2023

(54) MICROFLUIDIC DEVICE WITH INTEGRATED MICRO-STRUCTURED ELECTRODES AND METHODS THEREOF

(71) Applicant: Indian Institute of Science, Bangalore (IN)

(72) Inventors: Jatin Panwar, Bangalore (IN); Rahul Roy, Bangalore (IN); Usama Ahmed Abbasi, Bangalore (IN); Prakhar Jain, Bangalore (IN); Viswanathan Kumaran, Bangalore (IN)

(73) Assignee: Indian Institute of Science, Bangalore (IN)

( * ) Notice: Subject to any disclaimer, the term of this patent is extended or adjusted under 35 U.S.C. 154(b) by 356 days.

(21) Appl. No.: 16/954,140

(22) PCT Filed: Dec. 14, 2018

(86) PCT No.: PCT/IB2018/060094
§ 371 (c)(1),
(2) Date: Jun. 15, 2020

(87) PCT Pub. No.: WO2019/116336
PCT Pub. Date: Jun. 20, 2019

(65) Prior Publication Data
US 2021/0162410 A1    Jun. 3, 2021

(30) Foreign Application Priority Data
Dec. 14, 2017   (IN) .............................. 201741045044

(51) Int. Cl.
*B01L 3/00* (2006.01)
*B81B 1/00* (2006.01)
(Continued)

(52) U.S. Cl.
CPC ... *B01L 3/502715* (2013.01); *B01L 3/502707* (2013.01); *B01L 3/502761* (2013.01);
(Continued)

(58) Field of Classification Search
CPC ......... B01L 3/502715; B01L 3/502707; B01L 3/502761; B01L 2200/0647;
(Continued)

(56) References Cited

U.S. PATENT DOCUMENTS

| 9,658,240 B2 | 5/2017 | Orwar et al. |
| 2014/0147930 A1* | 5/2014 | Orwar ..................... B01L 3/021 422/502 |

FOREIGN PATENT DOCUMENTS

WO   2019116336 A1   6/2019

* cited by examiner

*Primary Examiner* — Brian J. Sines
(74) *Attorney, Agent, or Firm* — Rahman LLC

(57) ABSTRACT

The present disclosure provides a microfluidic device comprising a set of micro-structured electrodes. The electrodes are made of a fusible alloy such as Field's Metal and are patterned on a layer of PDMS. The molten fusible alloy is poured over the patterned PDMA layer and a suction force is applied to ensure uniformity of flow of the molten metal. A second layer comprising a flow channel orthogonal to the direction of the micro-structured electrodes is disposed under the first layer to form the microfluidic device. The device shows enhanced sensitivity to RBC detection at high frequencies that are also bio-compatible (above 2 MHz). Multiple layers of the micro-structures electrodes can be sandwiched between layers of flow channels to provide a 3D microfluidic device.

11 Claims, 12 Drawing Sheets

(51) Int. Cl.
 *B81C 1/00* (2006.01)
 *G01N 15/10* (2006.01)
(52) U.S. Cl.
 CPC .......... *B81B 1/006* (2013.01); *B81C 1/00119* (2013.01); *G01N 15/1031* (2013.01); *G01N 15/1056* (2013.01); *B01L 2200/0647* (2013.01); *B01L 2200/12* (2013.01); *B01L 2300/0645* (2013.01); *B01L 2300/0887* (2013.01); *B81B 2201/057* (2013.01); *B81B 2203/0338* (2013.01); *B81B 2203/04* (2013.01)
(58) Field of Classification Search
 CPC ......... B01L 2200/12; B01L 2300/0645; B01L 2300/0887; G01N 15/1031; G01N 15/1056; G01N 15/0073; G01N 2015/1006; B81B 2203/0338; B81B 2201/0657; B81B 2203/04; B81C 1/00119
 See application file for complete search history.

MICROFLUIDIC DEVICE WITH INTEGRATED MICRO-STRUCTURED ELECTRODES AND METHODS THEREOF

CROSS-REFERENCE TO RELATED APPLICATIONS

This application is a 371 national stage application of PCT/IB2018/060094 filed on Dec. 14, 2018, which claims priority to Indian Patent Application No. 201741045044 filed on Dec. 14, 2017, the complete disclosures of which, in their entireties, are herein incorporated by reference.

TECHNICAL FIELD

The present disclosure generally relates to the field of microfluidics. In particular, the present disclosure provides a microfluidic device for detection of single biological cells.

BACKGROUND

Background description includes information that may be useful in understanding the present invention. It is not an admission that any of the information provided herein is prior art or relevant to the presently claimed invention, or that any publication specifically or implicitly referenced is prior art.

The most common type of integrated electrodes used in microfluidics are metal electrodes of gold and platinum, fabricated using metal sputtering/vapor deposition and multiple lithography steps that require a clean room environment and expensive equipment.

The widely-used Platinum/Gold electrodes have economic and logistic limitations. There have been continued efforts to develop cheaper and efficient microelectrode fabrication techniques with equivalent efficiency, robustness and consistency of Platinum/Gold electrodes. As a low-cost alternative, injected gallium electrodes are used for capacitively coupled conductivity detection within a microchip electrophoresis device. Salt water electrodes have also been used to generate electric fields within a polydimethylsiloxane (PDMS) based device for droplet merging and sorting.

However, these non-contact electrodes have limited sensitivity in particle and flow detection because of attenuated charge density and electric field strength.

There is therefore a requirement in the art for in-contact electrodes with high sensitivity in the desired frequency range and that can also be fabricated using lower cost materials and outside of a clean room.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, the numbers expressing quantities or dimensions of items, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

OBJECTS

A general object of the present disclosure is to provide a fluidic device for the detection of suspended single cells in a sample.

Another object of the present disclosure is to provide micro-structured electrodes for the device.

Another object of the present disclosure is to provide a device that shows enhanced sensitivity at bio-compatible electrical frequencies.

Another object of the present disclosure is to provide a 3D microfluidic device with integrated microelectrodes.

Another object of the present disclosure is to provide a method to fabricate a microfluidic device outside of a clean room that can perform sensitive electrical detection of cells.

SUMMARY

The present disclosure generally relates to the field of microfluidics. In particular, the present disclosure provides a microfluidic device for detection of single cells using impedance differences. This method of detection is an implementation of microfluidic impedance cytometry (MIC).

In an aspect, the present disclosure provides a method for fabricating a microfluidic device, said method comprising the steps of; coating a negative photo resist on a substrate; casting polymeric microstructures using photoresist masks; introducing a molten fusible alloy (FA) into a first layer made of a polymer material; placing the first layer from over a second layer made of the polymer material; fusing the first layer and the second layer; and placing a third layer comprising a flow channel under the first layer.

In another aspect, the molten fusible alloy (FA) is introduced into a first layer made of a polymer material and comprising one or more parallel independent channels for corresponding one or more electrodes, wherein the one or more independent channels converge and run in parallel in close proximity at a detection point.

In another aspect, the first layer and the second layer are fused with heat such that there are no air bubbles between the first electrode layer and second electrode layer.

In another aspect, the third layer comprising a flow channel is placed under the first layer such that the flow channel runs orthogonal to the one or more independent channels on the first electrode layer.

In another aspect, an object of interest present in a fluid medium passes through the flow channel to be dispersed as droplets at the point of detection.

In another aspect, the device detects presence of the object of interest based on change in impedance between the one or more electrodes at the detection point.

In an embodiment, the coated substrate is a silicon (Si) wafer coated with polydimethylsiloxane (PDMS).

In another embodiment, the fusible alloy is selected from a group consisting Field's Metal, Rose's Metal, Cerrosafe, Wood's metal, Cerrolow 136 and Cerrolow 117.

In an aspect, a controlled suction pressure is applied to achieve smooth flow and even distribution of the molten FA on the one or more electrode channels.

In another aspect, the method further comprises the step of peeling the sacrificial second layer before introducing the third layer.

In another aspect, the method further comprises the step of subjecting the first layer and second layer to a plasma treatment. In an embodiment, the device is baked to increase hydrophobicity of the device.

The present disclosure provides a microfluidic device comprising: a substrate coated with a negative photoresist; a first layer comprising one or more parallel independent electrodes; and a second layer disposed under the first layer.

In another aspect, the first layer comprises one or more parallel independent electrodes made if a fusible alloy (FA), wherein the one or more independent electrodes converge at a detection point.

In another aspect, the second sacrificial layer under the first layer is disposed and the second layer comprises a flow channel running orthogonal to the direction of the one or more electrodes.

In another aspect, an object of interest present in a fluid medium passes through the flow channel to be dispersed as droplets at the point of detection. In another aspect, the device detects presence of the object of interest based on change in impedance between the one or more electrodes at the detection point, as measured by a frequency modulated lock-in detection.

In another aspect, the second layer is fused to a glass slide to provide rigidity to the device.

In another aspect, two or more layers comprising the one or more electrodes is disposed with a crosslinked photoresist layer comprising of a flow channel in between two layers comprising the one or more electrodes to provide a 3-dimensional (3D) device.

Various objects, features, aspects and advantages of the inventive subject matter will become more apparent from the following detailed description of preferred embodiments, along with the accompanying drawing figures in which like numerals represent like components.

BRIEF DESCRIPTION OF DRAWINGS

The accompanying drawings are included to provide a further understanding of the present invention and are incorporated in and constitute a part of this specification. The drawings illustrate exemplary embodiments of the present invention and, together with the description, serve to explain the principles of the present invention.

DETAILED DESCRIPTION

Figure 1A:
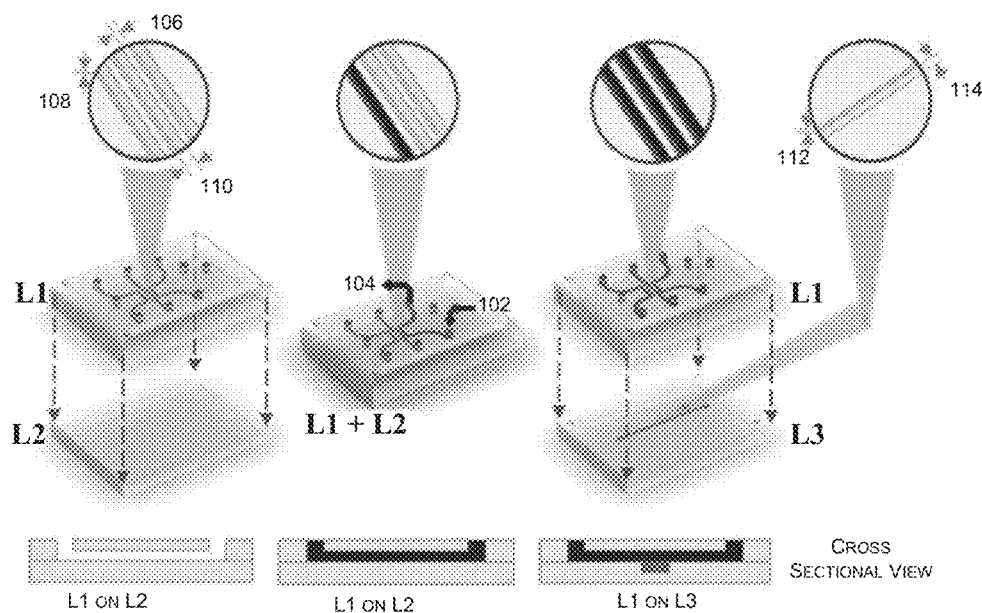
FIG. 1A illustrates exemplary steps for the fabrication of the proposed electrode, in accordance with embodiments of the present disclosure.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

If the specification states a component or feature "may", "can" "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Exemplary embodiments will now be described more fully hereinafter with reference to the accompanying drawings, in which exemplary embodiments are shown. These exemplary embodiments are provided only for illustrative purposes and so that this disclosure will be thorough and complete and will fully convey the scope of the invention to those of ordinary skill in the art. The invention disclosed may, however, be embodied in many different forms and should not be construed as limited to the embodiments set forth herein. Various modifications will be readily apparent to persons skilled in the art. The general principles defined herein may be applied to other embodiments and applications without departing from the spirit and scope of the invention. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure). Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

The use of any and all examples, or exemplary language (e.g., "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

FIG. 1A illustrates exemplary steps for the fabrication of the proposed electrode, in accordance with embodiments of the present disclosure. In an embodiment, the electrode is fabricated by casting a molten metal alloy on a composite patterned mould.

In another embodiment, the fabricated micro-structured electrode is made of a metal alloy with a low melting point. Typically, metal alloys are preferable whose melting point is within about 100° C. the metal alloy can be selected from a group consisting Rose's metal, Cerrosafe, Wood's metal, Cerrolow 136, Cerrolow 117, Field's metal etc. in an exemplary embodiment, the metal alloy used in the fabrication of the proposed micro-structure is Field's metal (FM) comprising bismuth (about 32.5%), indium (about 51%), and tin (about 16.5%). In another embodiment, FM has a melting point of about 62° C., which is low enough that it can be handled easily during fabrication, but high enough that it does not deform during operation.

In another embodiment, the composite patterned mould comprises multiple layers of patterned polymeric mould made of a polymer such as polydimethylsiloxane (PDMS).

In another embodiment, the microfluidic device and the micro-structured electrode are fabricated separately using standard soft photolithographic processes. A standard epoxy based negative photoresist is spin coated on a silicon wafer to obtain a film thickness of about 20 μm.

In another embodiment, electrode layer L1 comprises three independent channels of about 100 μm that converge to a width of about 30 μm (110) and an inter-electrode gap of about 20 μm (106, 108) at the detection point for electrodes along with inlet (102) and outlet (104) ports for the molten metal flow. A sacrificial base layer L2 made of PDMS is used for casting of the electrodes. In another embodiment, the low surface roughness and flexibility of PDMS provides an effective airtight seal when the layers L1 and L2 are placed over one another, and the air bubbles are removed. In another embodiment, the layers L1 and L2 are heated to at about 140° C. for about 20 minutes to fuse the two layers.

In another embodiment, about 15 μl of molten FM (hereinafter, also referred to as Fusible Alloy (FA)) at about 140° C. is introduced into the inlet. To enhance flow of the molten metal alloy in the channel, a suction pressure (about 82 kPa) is applied at the outlet of the mould until the molten FM flows till the outlet port. In another embodiment, the suction pressure also serves to hold layers L1 and L2 together, thereby not requiring an additional bonding agent.

In another embodiment, L1 is peeled off after FM solidifies. In another embodiment, a third layer L3 is a flow layer with a flow channel of about 70 μm width and converging to about 20 μm (112, 114) at the detection point and running perpendicular to the electrode channels of layer L. Layers L1 and L3 are aligned using guide marks present on them. After a plasma treatment, they are bonded. In another embodiment, a glass slide is bonded with the bottom of L3, the lowest layer, for additional device rigidity.

Figure 1B:
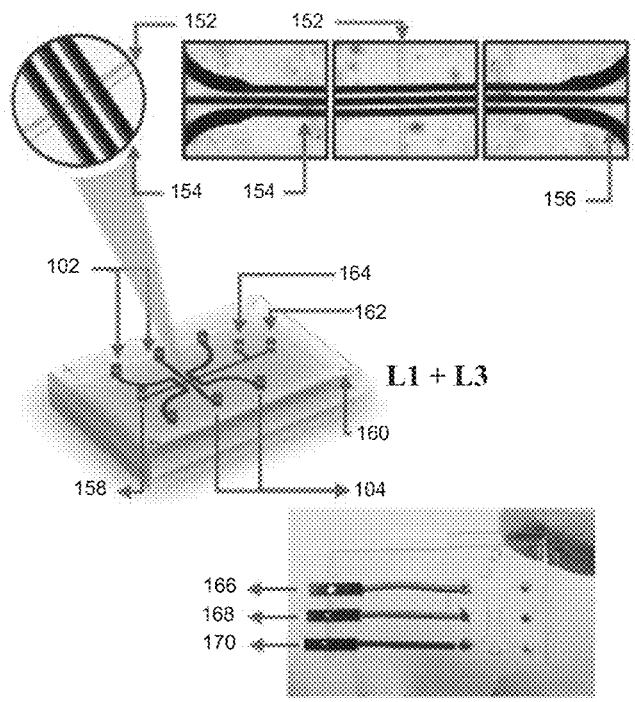
FIG. 1B illustrates an exemplary schematic representation and optical image of the proposed electrode.

FIG. 1B illustrates an exemplary schematic representation and optical image of the proposed electrode.

In another embodiment, in order to overcome the reduced hydrophobicity of the PDMS due to plasma treatment, the device is kept overnight in an oven at a temperature below the FM melting point, at about 45° C. In another embodiment, since the material used is uniform, the surface properties of the walls of the channels are uniform. This is especially pertinent, as non-uniform hydrophobicity can cause fluid droplets to cling to the walls of the channel.

In another embodiment, the device fabricated has a fluidic channel (152) passing under an array of "in-contact" 2D co-planar micro-electrodes (154).

Figure 2A:
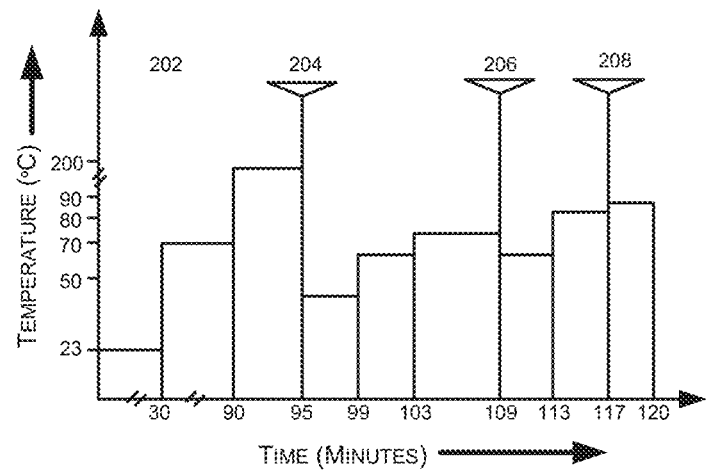
FIG. 2A illustrates an exemplary graphical representation of the steps involved in fabrication of the fluidic device, in accordance with embodiments of the present disclosure.

FIG. 2A illustrates an exemplary graphical representation of the steps involved in fabrication of the fluidic device, in accordance with embodiments of the present disclosure.

In an embodiment, a PDMS coated silicon wafer is formed by allowing a specified quantity (about 5 g) of PDMS with a 9:1 cross-linking ratio to flow freely through the edges of the wafer for about 30 minutes before cross-linking the PDMS. In another embodiment, a standard photolithography procedure is adopted to fabricate SU8 microchannels on the PDMS coated wafers.

In another embodiment, the optimum baking temperature for SU8 is about 95° C., but, as PDMS does not provide good adhesion, the photoresist tends to recede from the edges and shrink towards the centre of the wafer. In order to circumvent this problem, a prolonged soft baking is done at lower temperatures, where the wafer is heated to about 50° C. for about 4 minutes (202); about 70° C. for about 4 minutes (204); and about 90° C. for about 4 minutes (206). Following the soft baking, the wafer is rinsed and air dried. Hard baking is then done for about 3 minutes at about 95° C. (208). The baked PDMS layer is removed from the silicon wafer.

In another embodiment, to assemble a 3D electrode assembly, two coplanar electrodes are fabricated on a thin PDMS layer, as has been described earlier. In another embodiment, the first coplanar electrode (254) is aligned with the SU8 channel (256) and placed on it. The PDMS layer behind the SU8 is peeled off. The thin layer of SU8 from the coplanar electrode forms a seal with the PDMS without application of any external pressure.

In another embodiment, alignment of the second layer of coplanar electrodes (258) onto the existing assembly requires higher precision as the electrodes of the two coplanar layers must align with one another.

Figure 2B:
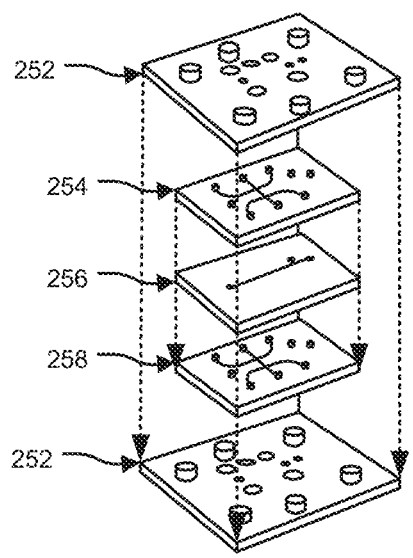
FIG. 2B illustrates an exemplary modular 3D microelectrode assembly, in accordance with embodiments of the present disclosure.

FIG. 2B illustrates an exemplary modular 3D micro-electrode assembly, in accordance with embodiments of the present disclosure. In an embodiment, as earlier, the SU8 layer forms an air seal with the PDMS of the second coplanar electrode too. In another embodiment, the 3D SU8-PDMS assembly will be lacking in robustness and rigidity as no plasma bonding between the layers or a glass slide exists. In another embodiment, two laser cut acrylic sheets (252) are used to tighten the 3D assembly and make it robust.

Figure 2C:
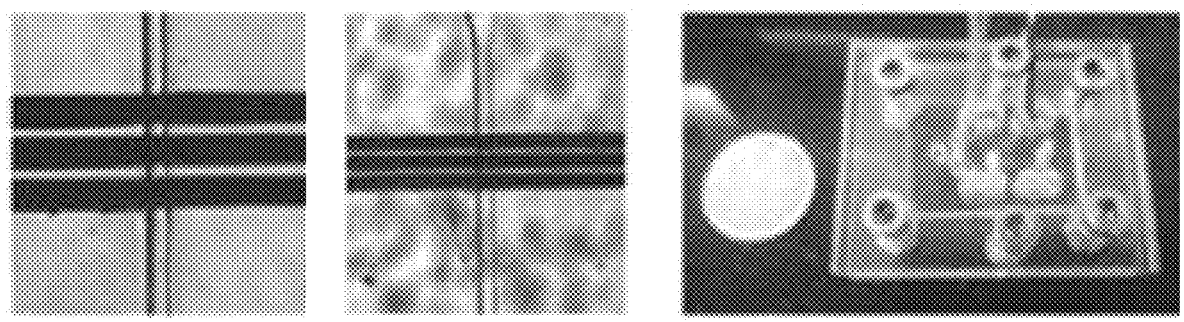
FIG. 2C illustrates exemplary optical images of the proposed 3D modular fluidic device with FM electrodes, in accordance with embodiments of the present disclosure.

FIG. 2C illustrates exemplary optical images of the proposed modular fluidic device with FM electrodes, in accordance with embodiments of the present disclosure.

In another embodiment, the fluidic device can be decoupled for cleaning the fluidic channels in case of clogging. In an exemplary embodiment, the final modular assembly comprises a 20 μm wide microchannel crossing between two coplanar electrodes arrays orthogonally, each containing three 20 μm wide electrodes each. Each electrode is analogous to three parallel plate capacitors of area 20×20 μm$^2$.

In an embodiment, the coplanar "in-contact" electrodes are characterised by measuring their response to varying input frequencies (0.1 to 10 MHz) and peak-to-peak source voltage (0.2 to 2 V) at different electrolyte concentrations (0 to 10×; concentration with respect to Phosphate Buffer Saline (PBS)). The characterisation is performed in the given sequence to determine an optimum configuration for peak-to peak voltage ($V_{p-p}$), source frequency and electrolyte concentration.

In another embodiment, the FM is prone to electrolysis at high currents, and therefore, a linear response from the electrodes with varying electrical parameters is not as accurate as in the case of Platinum electrodes.

In another embodiment, in order to overcome this limitation, the mean output voltage ($V_{RMS}$) response of the electrodes is measured at different electrolyte concentrations averaged over an excitation frequency range (0.5 to 10 MHz).

Figure 3A:
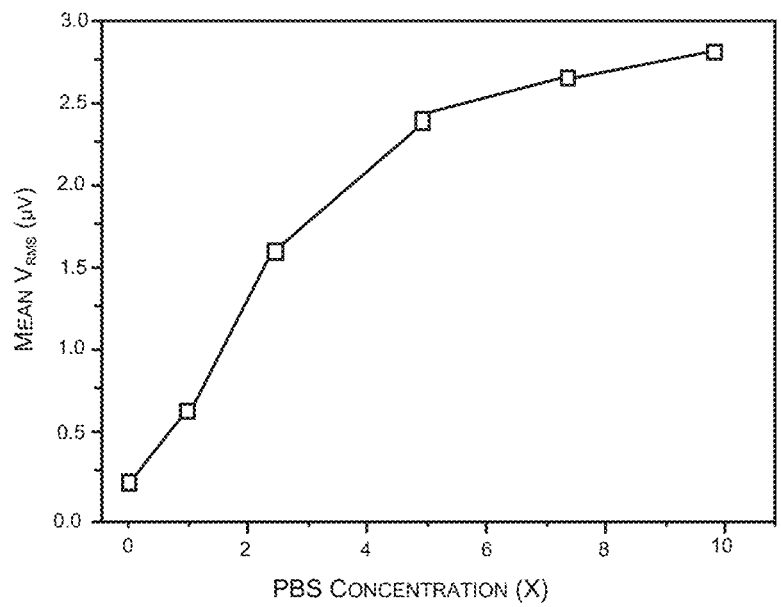
FIG. 3A illustrates an exemplary measurement of output voltage ($V_{RMS}$) as a function of increasing electrolyte concentration (concentration with respect to Phosphate Buffer Saline (PBS)) in the proposed 2D "in-contact" FA electrode.

FIG. 3A illustrates an exemplary measurement of output voltage ($V_{RMS}$) as a function of increasing electrolyte concentration (PBS) in the proposed 2D "in-contact" FM electrode. In an embodiment, the concentration of the electrolyte at which $V_{RMS}$ is highest is selected for further characterisation. In another embodiment, the resulting plot confirms the electrochemical stability of the electrodes at the highest available voltage ($2V_{p-p}$) and the highest biocompatible electrolyte concentration (OX PBS).

Figure 3B:
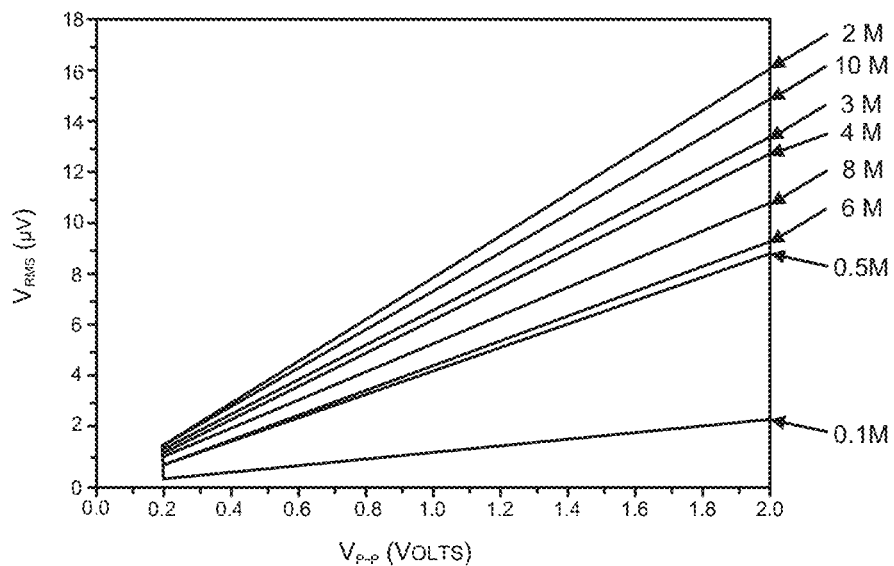
FIG. 3B illustrates an exemplary voltage sweep performed through a range of frequencies (0.1 to 10 MHz) in the proposed 2D "in-contact" FA electrode.

FIG. 3B illustrates an exemplary voltage sweep performed through a range of frequencies (0.1 to 10 MHz) in the proposed 2D "in-contact" FM electrode. In an embodiment, it can be seen that $V_{RMS}$ increases linearly with $V_{p-p}$. This suggests that the electrochemical stability of the electrodes cab be extrapolated to even higher source voltages.

Figure 3C:
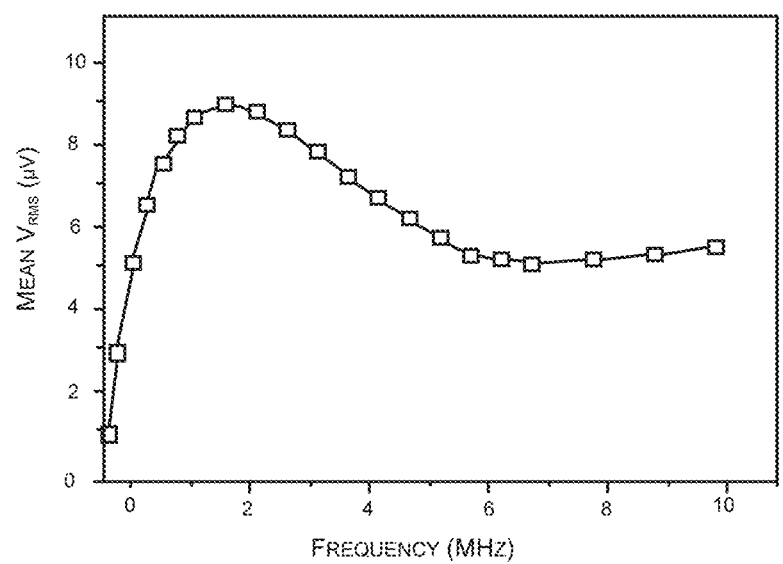
FIG. 3C illustrates an exemplary frequency sweep performed through a range of frequencies (0.1 to 10 MHz) averaged over different $V_{p-p}$ values (0.5, 1, 1.5 and 2 V) in the proposed 2D "in-contact" FM electrode.

FIG. 3C illustrates an exemplary frequency sweep performed through a range of frequencies (0.1 to 10 MHz) averaged over different $V_{p-p}$ values (0.5, 1, 1.5 and 2 V) in the proposed 2D "in-contact" FM electrode. In an embodiment, the mean response plotted shows a non-linear frequency response with a maximum observed at 2 MHz. In another embodiment, this can be due to deteriorating impedance as capacitive coupling dominates at high frequencies.

In an embodiment, to establish the proposed candidates as a potential candidate for MIC, it is compared against standard Platinum (Pt) electrodes in a set-up to detect erythrocytes from a sample of erythrocyte-enriched human blood. In another embodiment, the frequency dependence of the erythrocyte signals is explored at the parameters optimised during characterisation as previously described, i.e., at 10×PBS and 2 $V_{p-p}$.

Figure 4A:
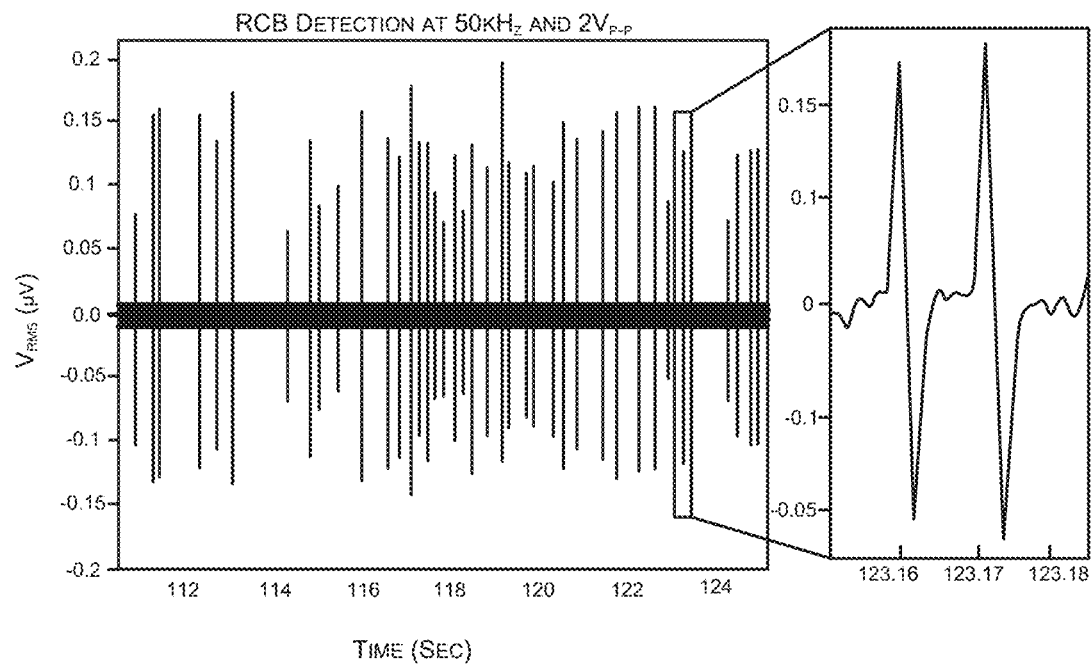
FIG. 4A illustrates a typical microfluidic impedance cytometry (MIC) signal where each peak represents impedance change due to passage of a single erythrocyte (RBC) across the electrode assembly. In an aspect, the squeezed sine waves is a signature of particle detection in the MIC set-up.

FIG. 4A illustrates a typical MIC signal where each peak represents a single RBC detection. In an aspect, the squeezed sine waves is a signature of particle detection in the MIC set-up. The wide peak height distribution is a result of varying position and distance of cells as they pass over the electrode with a little contribution from inherent polydispersity among cell sizes.

Figure 4B:
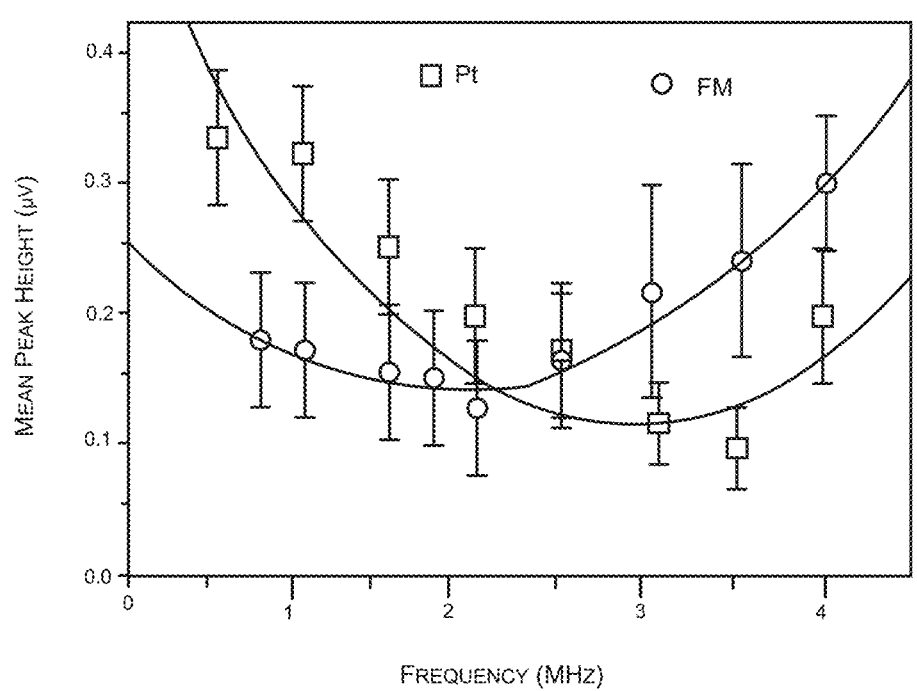
FIG. 4B illustrates an exemplary comparison of mean peak heights of the MIC signal during RBC detection using the proposed electrode and a standard Pt electrode at different lock-in detection frequencies.

FIG. 4B illustrates an exemplary comparison of mean peak heights of the MIC signal during RBC detection using the proposed electrode and a standard Pt electrode. In an embodiment, the detection is carried out at the configured frequencies and $2V_{p-p}$ source voltage. In another embodiment, for this experiment, RBC enriched human blood, as a representation of single cell suspension, was diluted 10,000 times with 10×PBS.

In another embodiment, the highest peaks obtained for the proposed electrode is at 0.5 MHz and 3 MHz source, and for Pt electrodes is at 0.5 MHz and 1 MHz source.

Figure 4C:
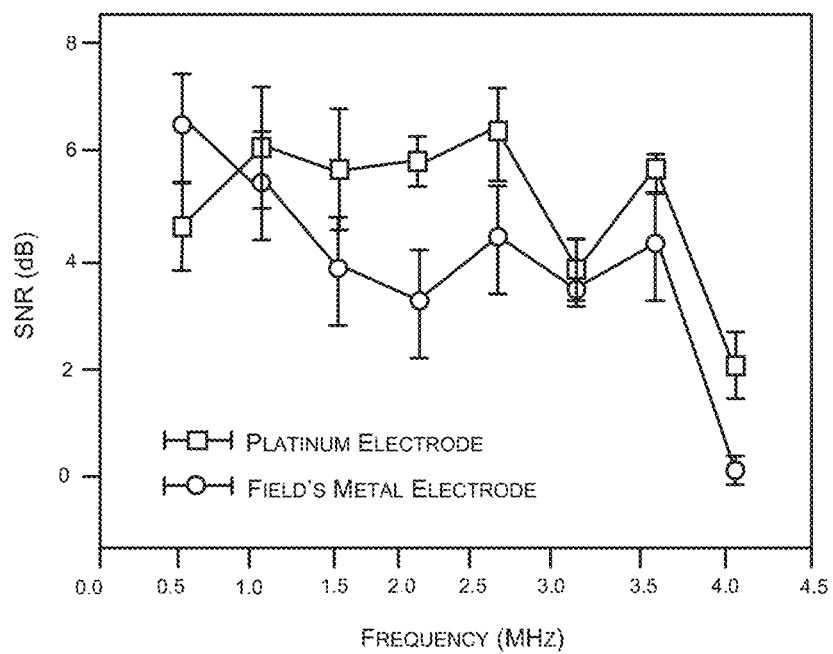
FIG. 4C illustrates an exemplary comparison of signal to noise ratio (SNR) during RBC detection by the proposed electrode and a standard Pt electrode.

FIG. 4C illustrates an exemplary comparison of signal to noise ratio (SNR) during RBC detection by the proposed electrode and a standard Pt electrode. In an embodiment, the comparison of SNR is over a frequency range of 0.5 MHz to 4 MHz, the measured noise levels are strongly dependent on experimental conditions such as background electromagnetic radiation, and a slight change can cause a difference in the measured SNR.

In another embodiment, it can be observed from FIGS. 4B and 4C that the performance of the proposed electrodes is on par or even better than Pt electrodes.

Figure 5A:
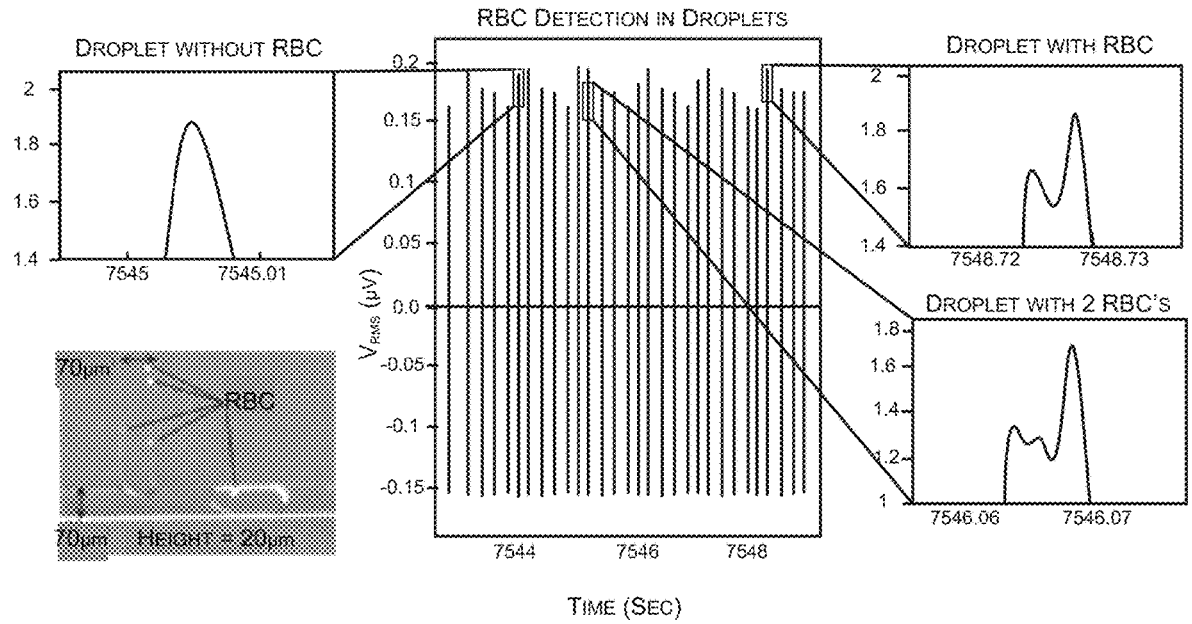
FIG. 5A illustrates a representative droplet detection signal as measured by the present MIC set-up, in accordance with embodiments of the present disclosure.

FIG. 5A illustrates an exemplary droplet detection signal as measured by the present MIC set-up, in accordance with embodiments of the present disclosure. In an embodiment, the zoomed images represent signature peaks for droplets containing no RBC, one RBC and two RBCs. The inset image illustrates an exemplary image of the proposed device used for the droplet detection.

Figure 5B:
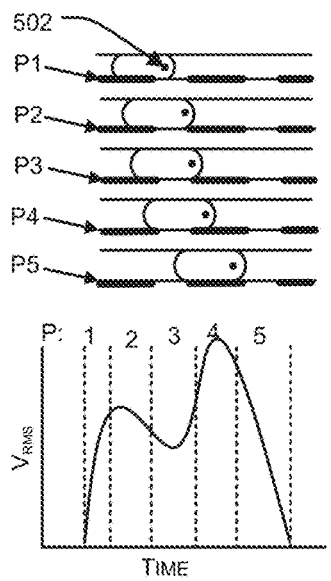
FIG. 5B illustrates an exemplary signature detection waveform from the proposed electrode as a composite of discrete components as the droplet carrying a cell like particle travels over different positions (P1, P2, P3, P4) of the proposed electrode.

FIG. 5B illustrates an exemplary signature detection waveform from the proposed electrode as a composite of discrete components as the droplet travels over different positions (P1, P2, P3, P4) of the proposed electrode. In an embodiment, dot (502) in the image represents a cell, entrapped in an aqueous microdroplet and carried by a non-miscible carrier liquid in the channel.

Figure 5C:
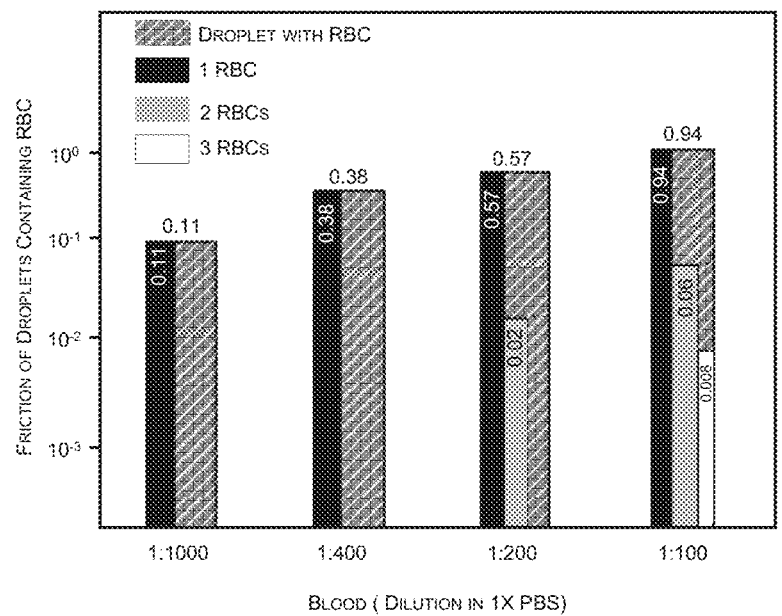
FIG. 5C illustrates an exemplary representation of the number of RBCs detected as single cells by the proposed electrode in droplets containing human blood at different dilutions.

FIG. 5C illustrates an exemplary representation of the number of RBCs detected by the proposed electrode in droplets containing human blood at different dilutions.

Figure 5D:
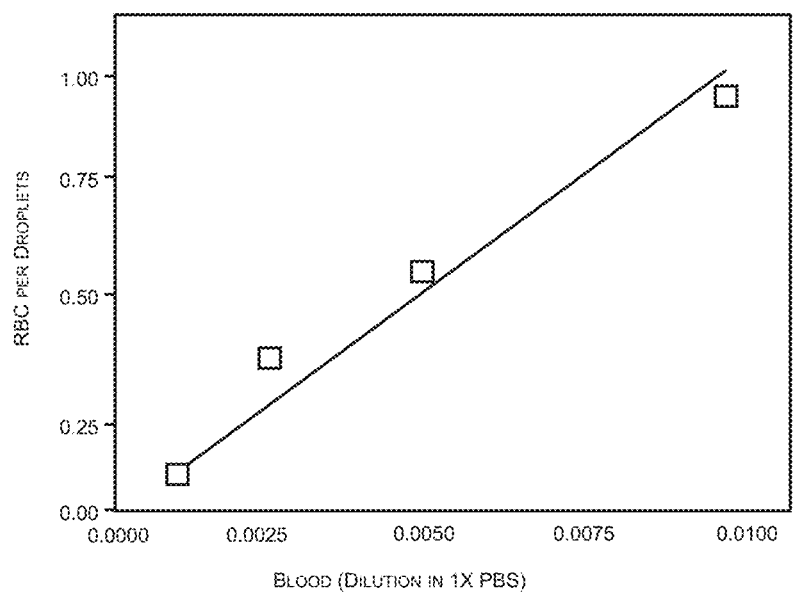
FIG. 5D illustrates an exemplary representation of the fraction of RBC containing droplets as a function of dilution factor of the blood sample as measured with MIC and verified optically.

FIG. 5D illustrates an exemplary representation of the fraction of the RBC containing droplets as a function of dilution of the blood sample. In an embodiment, the expected linear correlation of the MIC results and optically measured fraction is shown by the linear fit. The signals were taken at a 1 MHz frequency and 2 $V_{p-p}$ source voltage.

Figure 6A:
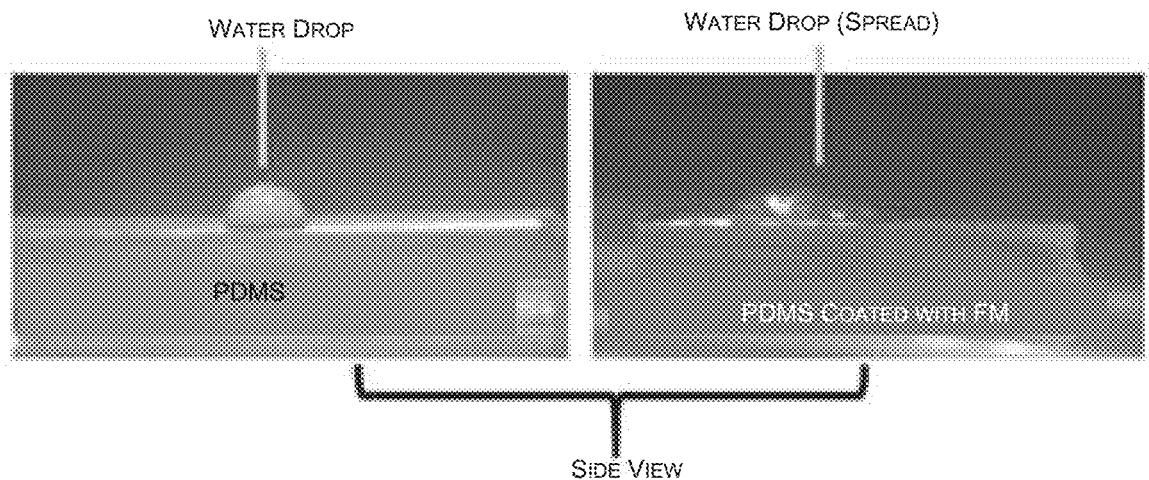
FIGS. 6A and 6B illustrate a comparison between the hydrophobicity of PDMS and a FA coated PDMS surfaces, in accordance with embodiments of the present disclosure.
Figure 6B:
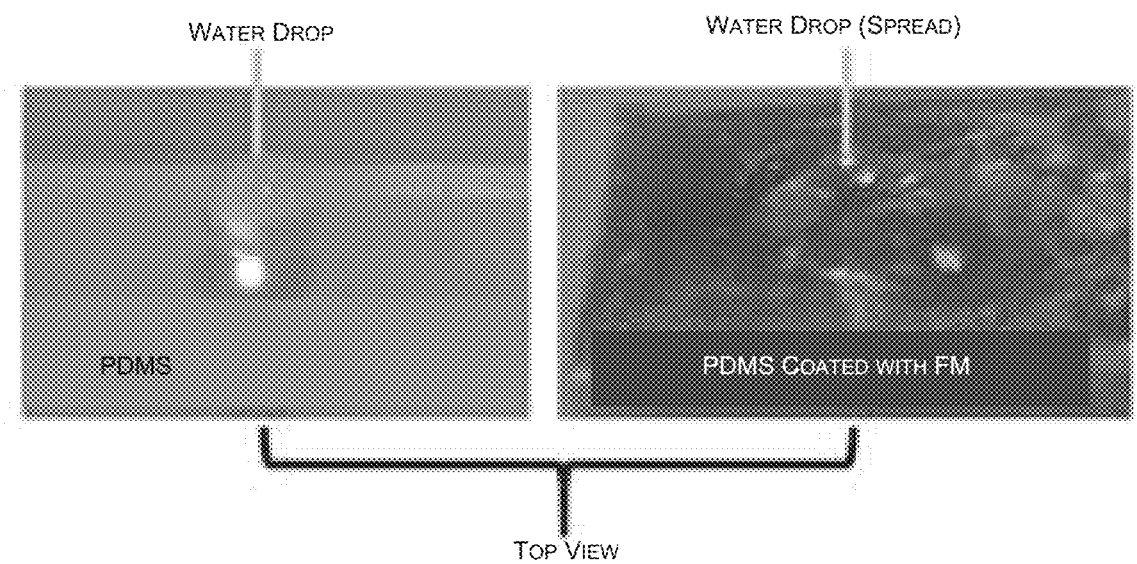

FIGS. 6A and 6B illustrate a comparison between the hydrophobicity of PDMS and a FM coated PDMS, in accordance with embodiments of the present disclosure. In an embodiment, it can be seen that a water droplet on PDMS shows a high contact angle while the drop spreads on the surface of FM coated PDMS.

In an aspect, signals taken from fusible alloy (FA) microelectrodes show discrete frequency dependent characteristics when compared to those taken by standard Platinum electrodes. At low frequencies, Pt electrodes give a higher signal, but as the frequency shifts to above 2 MHz, the FM electrodes give a higher signal.

$$Z_{sys} = \frac{1}{\omega C_{DL}} + \frac{R_m(1 + \omega R_i C_{mem})}{\omega R_m C_m + (1 + \omega R_i C_{mem})(1 + \omega R_m C_m)}$$

$Z_{sys}$ is the impedance of the system:
$C_{DL}$ is the double layer capacitance;
$R_i$ and $R_m$ are the resistances provided by the medium and the cell's cytoplasm respectively:
$C_{in}$ and $C_{mem}$ are the capacitances provided by the medium and cell membrane respectively:
$\omega$ is the frequency of the excitation signal.

According to the above equation (1), double layer capacitance ($C_{DL}$) dominates the impedance ($Z_{sys}$) of the system at lower frequency regime. Higher the double layer, lower is the Impedance in this regime. In another aspect, the surface roughness is proportional to the double layer capacitance at the electrode-electrolyte interface partly due to the high effective area of rough surfaces. A higher surface roughness for FM electrode in comparison to the Pt electrode can explain its behavior at low frequencies.

Figure 7A:
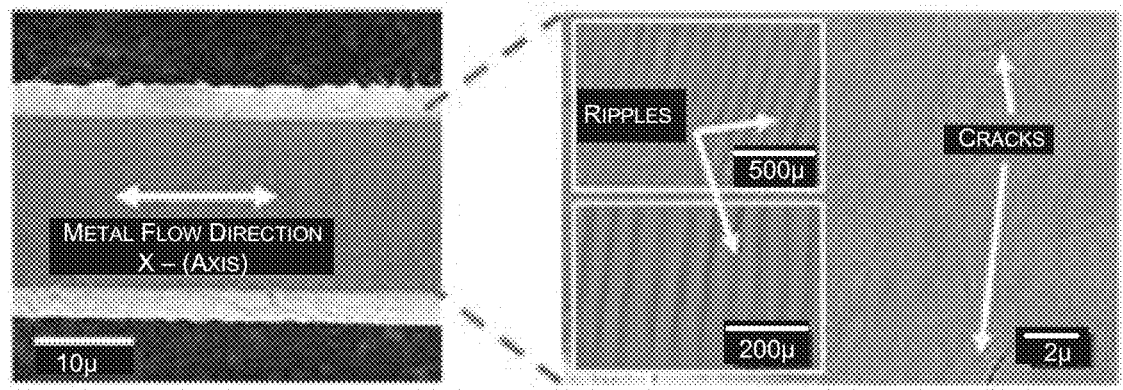
FIGS. 7A and 7B illustrate exemplary SEM micrographs for the proposed FA electrode and Pt electrode, respectively.
Figure 7B:
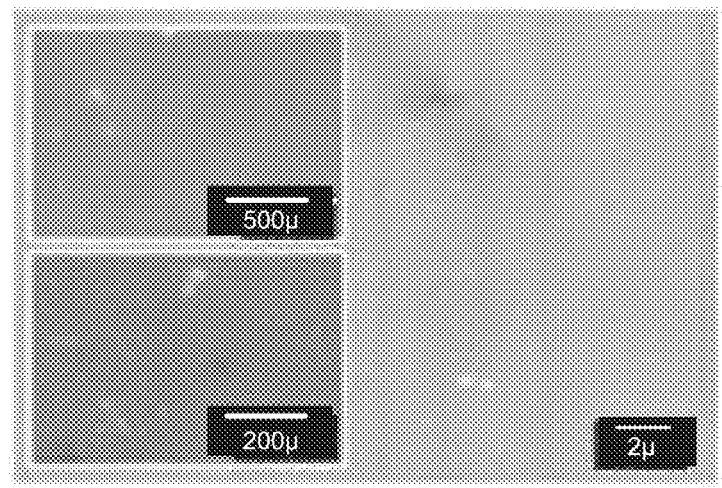

FIGS. 7A and 7B illustrate exemplary SEM micrographs for the proposed electrode and Pt electrode respectively. In an embodiment, the FM surface shows a distinct ripple like pattern along with cracks, contributing to a higher surface area per unit area (also called as effective area). The formation of these ripples and cracks is primarily an effect of volume contraction during solidification with a little contribution from Marangoni effect induced surface tension gradients caused by non-uniform temperature distribution.

Figure 7C:
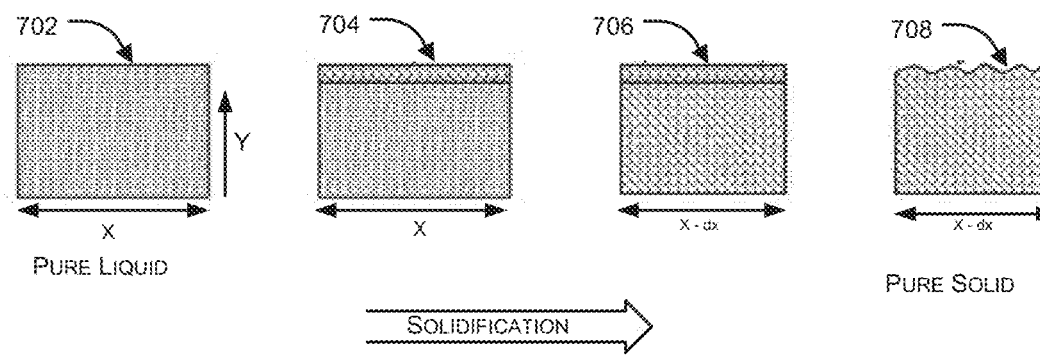
FIG. 7C illustrates a representation of crust induced ripple formation as molten metals cool and solidifies, undergoing thermal contraction.

FIG. 7C illustrates a representation of crust induced ripple formation as molten metal cools and solidifies, undergoing thermal contraction (702, 704, 706, 708). In an aspect, the contraction along the Y and Z axes is assumed insignificant due to low heat transfer coefficient of polymer walls as compared to metal in the X axis (flow direction). The observed directionality of ripples along X axis supports this. Higher effective area observed in SEM micrographs for FA surface provides for a higher double layer capacitance delivered by FA electrodes. The higher effective surface area also means higher overall capacitance for the system. Higher capacitance further signifies lower overall impedance of the system ($|Z_m|$) at a given frequency. This has an interesting effect on the sensitivity (S) of the microfluidic cytometer where $|Z_{mix}|$ is the impedance of system plus suspended particle or cell. Such a system with low $|Z_m|$ will have higher sensitivity, as given by, $$S = \frac{||Z_{mix}| - |Z_m||}{|Z_m|}$$

In another aspect, as the particle moving across a region over the FM electrode has to cut through more electric field lines (flux is proportional to charge density) and this results in higher differential current (and thus voltage) as compared to Pt electrode.

Figure 8:
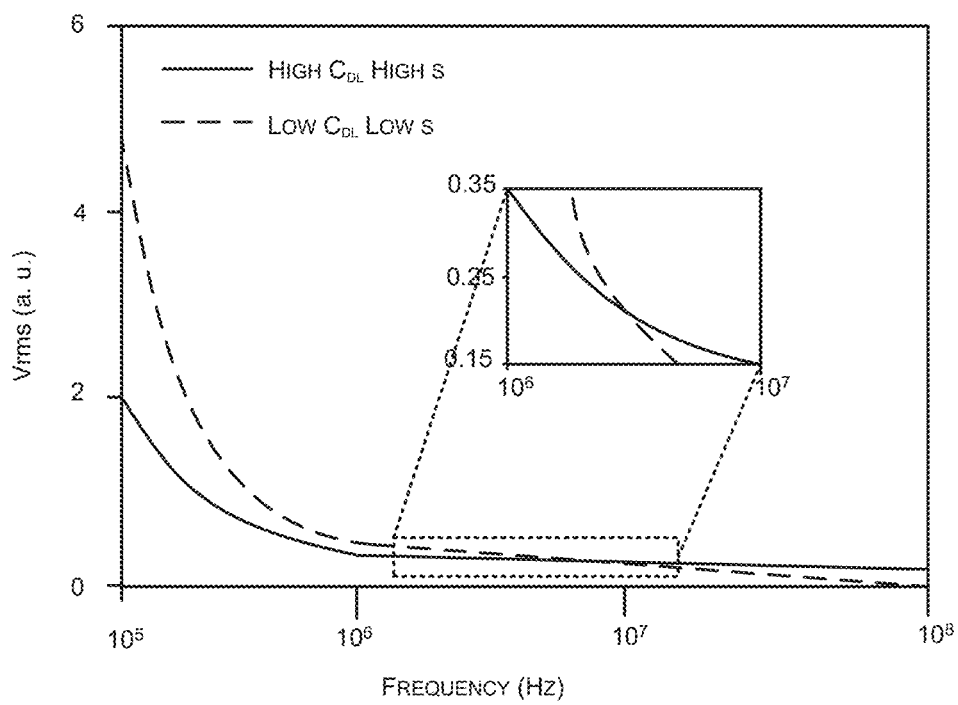
FIG. 8 illustrates an exemplary representation of simulation of $V_{RMS}$ is as a function of source frequency, $C_{DL}$ and sensitivity(S) for the proposed FA electrode and Pt electrode.

FIG. 8 illustrates an exemplary representation of simulation of $V_{RMS}$ as a function of source frequency $C_{DL}$ and S for the proposed FA electrode and Pt electrode. In an embodiment, the $V_{RMS}$ is simulated for a frequency range of 0.1 to 100 MHz. Simulation cases were compared between two cases: case1—with high $C_{DL}$ and high S (representing the FA electrode); and case2—with low $C_{DL}$ and low S (representing the Pt electrode). In another embodiment, it can be seen that, with other parameters kept constant, the FA electrode sensitivity is higher than that of the Pt electrode at high frequencies. It can be noted that the high frequency is the desired frequency domain for impedance based single cell quantification.

It should be apparent to those skilled in the art that many more modifications besides those already described are possible without departing from the inventive concepts herein. The inventive patient matter, therefore, is not to be restricted except in the spirit of the appended claims. Moreover, in interpreting both the specification and the claims, all terms should be interpreted in the broadest possible manner consistent with the context. In particular, the terms "includes" and "including" should be interpreted as referring to elements, components, or steps in a non-exclusive manner, indicating that the referenced elements, components, or steps may be present, or utilized, or combined with other elements, components, or steps that are not expressly referenced. Where the specification claims refer to at least one of something selected from the group consisting of A, B, C . . . and N, the text should be interpreted as requiring only one element from the group, not A plus N. or B plus N, etc. The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practised with modification within the spirit and scope of the appended claims.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

ADVANTAGES

The present disclosure provides a fluidic device for the detection of single cells in a sample.

The present disclosure provides design and fabrication of micro-structured electrodes in 3D for the device.

The present disclosure provides a device that shows enhanced sensitivity at bio-compatible frequencies.

The present disclosure provides a 3D microfluidic device.

The present disclosure provides a method to fabricate a microfluidic device that can be performed outside of a clean room.

We claim:

1. A method for fabricating a microfluidic device, said method comprising the steps of:
    coating a negative photoresist on a substrate;
    casting of an elastomeric polymer material to form microchannels;
    introducing a molten fusible alloy (FA) into a first layer made of the elastomeric polymer material and comprising one or more parallel independent microchannels for corresponding one or more electrodes, wherein the one or more parallel independent microchannels converge at a detection point;
    placing the first layer from over a second layer made of the elastomeric polymer material, wherein the second layer is un-patterned and is a sacrificial layer;
    fusing the first layer and the second layer with heat such that there are no air bubbles between the first layer and the second layer; and
    placing a third layer comprising a flow channel under the first layer such that the flow channel runs orthogonal to the one or more parallel independent microchannels on the first layer,
    wherein an object of interest present in a fluid medium passes through the flow channel by itself or to be dispersed as droplets at the detection point, and
    wherein the device detects presence of the object of interest based on change in impedance between the one or more electrodes at the detection point.

2. The method as claimed in claim 1, wherein the substrate is a silicon (Si) wafer coated with polydimethylsiloxane (PDMS).

3. The method as claimed in claim 1, wherein the molten fusible alloy is selected from a group consisting of Field's Metal, Rose's Metal, Cerrosafe, Wood's metal, Cerrolow 136 and Cerrolow 117.

4. The method as claimed in claim 1, wherein a controlled suction pressure is applied to exact smooth flow and even distribution of the molten fusible alloy on the one or more electrodes.

5. The method as claimed in claim 1, wherein said method further comprises the step of peeling the sacrificial layer before introducing the third layer.

6. The method as claimed in claim 1, wherein said method further comprises the step of subjecting the first layer and second layer to a plasma treatment.

7. The method as claimed in claim 1, wherein the microfluidic device is baked to increase hydrophobicity of the device.

8. The method as claimed in claim 1, wherein the microfluidic device comprises:
    the substrate coated with the negative photoresist;
    the elastomeric polymer to form the microchannels; and
    the first layer and the third layer disposed under the first layer.

9. The method as claimed in claim 1, wherein the second layer is fused to a glass slide to provide rigidity to the device.

10. The method as claimed in claim 1, wherein two or more layers comprising the one or more electrodes is disposed with a layer comprising a flow channel in between two layers comprising the one or more electrodes to provide a 3-dimensional (3D) device.

11. A microfluidic device fabricated by a method, said method comprising the steps of:
    coating a negative photoresist on a substrate;
    casting of an elastomeric polymer material to form microchannels;
    introducing a molten fusible alloy (FA) into a first layer made of the elastomeric polymer material and comprising one or more parallel independent microchannels for corresponding one or more electrodes, wherein the one or more parallel independent microchannels converge at a detection point;
    placing the first layer from over a second layer made of the elastomeric polymer material, wherein the second layer is un-patterned and is a sacrificial layer;
    fusing the first layer and the second layer with heat such that there are no air bubbles between the first layer and second layer; and
    placing a third layer comprising a flow channel under the first layer such that the flow channel runs orthogonal to the one or more parallel independent microchannels on the first layer,
    wherein an object of interest present in a fluid medium passes through the flow channel by itself or to be dispersed as droplets at the detection point, and
    wherein the device detects presence of the object of interest based on change in impedance between the one or more electrodes at the detection point.

* * * * *